United States Patent [19]

Abe

[11] Patent Number: 5,635,241
[45] Date of Patent: Jun. 3, 1997

[54] METHOD FOR PRODUCING THIN FILM AND APPARATUS THEREFOR

[75] Inventor: Yoshiyuki Abe, Matsudo, Japan

[73] Assignee: Agency of Industrial Science and Technology, Tokyo, Japan

[21] Appl. No.: 412,379

[22] Filed: Mar. 29, 1995

[30] Foreign Application Priority Data

Jun. 30, 1994 [JP] Japan .................................. 6-148847

[51] Int. Cl.⁶ ........................... B05D 3/12; C23C 16/00
[52] U.S. Cl. ........................ 427/240; 118/52; 118/64; 118/725; 118/728; 427/248.1; 427/255.5; 427/314
[58] Field of Search ................... 427/240, 248.1, 427/255.5, 314; 118/728, 52, 725, 64

[56] References Cited

U.S. PATENT DOCUMENTS

| | | | |
|---|---|---|---|
| 4,116,161 | 9/1978 | Steube | 118/49.1 |
| 4,758,449 | 7/1988 | Kimura et al. | 427/240 |
| 5,012,158 | 4/1991 | Nakatani et al. | 315/111.2 |
| 5,196,101 | 3/1993 | Thakoor | 204/192.26 |
| 5,198,272 | 3/1993 | Eisfeller | 427/251 |

FOREIGN PATENT DOCUMENTS

| | | |
|---|---|---|
| 260097 | 3/1988 | European Pat. Off. . |
| 409451 | 1/1991 | European Pat. Off. . |
| 450165 | 10/1991 | European Pat. Off. . |
| 4209384 | 4/1993 | Germany . |
| 55-15673 | 2/1980 | Japan . |
| 62-107059 | 5/1987 | Japan . |
| 63-100972 | 5/1988 | Japan . |
| 3068767 | 3/1991 | Japan . |
| 3-183654 | 8/1991 | Japan . |
| 5-3257 | 1/1993 | Japan . |
| 863881 | 3/1961 | United Kingdom . |
| 1284224 | 8/1972 | United Kingdom . |
| 2206608 | 1/1989 | United Kingdom . |
| 2262656 | 6/1993 | United Kingdom . |
| WO93/19217 | 9/1993 | WIPO . |

Primary Examiner—Janyce Bell
Attorney, Agent, or Firm—Spencer & Frank

[57] ABSTRACT

A method and an apparatus for producing a thin film. The method includes the steps of placing a substrate having a surface for receiving the thin film on a substrate holder disposed within a thin film production chamber, the production chamber being connected by an arm to a rotatable member; charging into the thin film production chamber a material to be deposited on the surface of the substrate; rotating the rotatable member to generate a centrifugal force thereby creating a gravity field throughout the production chamber having a direction toward the surface of the substrate; heating the substrate; and evaporating the material to be deposited by heating thereby accelerating the material to be deposited toward the surface of the substrate in a direction of the gravity field, whereby the material to be deposited is deposited on the surface of the substrate. Alternatively, the steps of charging and evaporating can be replaced with the step of supplying a raw gas of a material to be deposited as the thin film on the surface of the substrate via piping disposed within the rotatable member and the arm thereby accelerating the gas toward the surface of the substrate in a direction of the gravity field for decomposing the gas whereby the material to be deposited is deposited on the surface of the substrate.

15 Claims, 2 Drawing Sheets

5,635,241

METHOD FOR PRODUCING THIN FILM AND APPARATUS THEREFOR

BACKGROUND OF THE INVENTION

1. Field of the Invention

The present invention relates to a method and apparatus for producing a thin film on a substrate. The invention is important in the field of new functional devices, such as semiconductors, and superconductors.

2. Description of the Related Art

A technology for forming a thin film on a substrate or for coating a material surface with a film is now essential in the development of new functional devices, such as semiconductors metals, organic materials, composite materials and so forth. Various production processes and apparatuses involving physical vapor deposition such as vacuum deposition sputtering and so forth, chemical deposition such as chemical vapor deposition and so forth, flame coating, application and so forth, and apparatuses therefore have been developed.

In these production processes, there exist a variety of problems involving, for instance, the affinity between the materials to be formed into a thin film and the substrate, the physical and chemical stability of the thin film, controlling the film thickness and film quality and so forth. Such problems are becoming more and more severe as a function of the increasing variety of materials and the increasing complexity regarding the desired properties of the materials to be used.

SUMMARY OF THE INVENTION

An object of the present invention is to solve the problems set forth above and to provide a method for producing a thin film on a substrate, where the film is of a high quality and is deposited controllably and at a high deposition rate.

Another object of the present invention is to provide an apparatus which is effectively usable in the aforementioned process.

According to a first aspect of the present invention, there is provided a method for producing a thin film comprising the step of:

forming a thin film on a substrate under a gravity field.

wherein, the gravity field may be established by a centrifugal force.

The magnitude of the gravity field may exceed the magnitude of the earth's gravity (1G). Preferably the magnitude of the gravity field may be 3G or more.

The substrate may be heated and a material to be deposited thereon may be evaporated by being heated and thereafter be deposited on the substrate.

The substrate may be heated and a raw gas of a material to be deposited may be supplied on the heated substrate to form the thin film through a chemical reaction on a surface of the substrate.

According to a second aspect of the present invention, there is provided an apparatus for producing a thin film comprising:

at least one thin film production chamber housing a substrate; and means for generating a gravity field in the thin film production chamber.

wherein the thin film producing apparatus further comprise means for heating and evaporating the material to be deposited on the substrate.

The gravity field generating means may comprise a rotor rotating at high speed, and an arm connecting the rotor with the thin film production chamber.

A plurality of the thin film production chambers and the arms may be provided and arranged symmetrically with respect to the rotor.

According to the present invention, for example, in a chemical deposition method, as a result of high gravity, the generation of nuclei for precipitation is promoted more quickly than where gravity is not applied. Also, since convection is prompted by the creation of a high gravity environment, a film can be formed in a relatively short period of time. Since both diffusion and natural convection occur in the normal gravity field, they are likely to cause fluctuations in film thickness and film quality. However, in the high gravity field, since natural convection is far more prominent than diffusion, the thickness distribution becomes uniform even when a thick film is formed, and, furthermore, a uniform film quality can be obtained. Since the size of crystal grains constructing the film significantly increases as a function of an increase in gravity, a film with giant crystal grains can be formed under a high gravity field. Therefore, new function different from the existing thin films with fine crystal grain can be expected. By controlling the gravity field, or by positioning the substrate to be oblique to the direction of gravity, one can facilitate providing a gradient in the chemical species constructing the crystal, in the crystal grain size, and in the thickness of the film.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DETAILED DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be understood, however, by those skilled in the art that the present invention may be practiced without these specific details. The above not withstanding, well-known features of the invention have not been shown in detail in order to avoid unnecessarily obscuring the present description.

Figure 1:
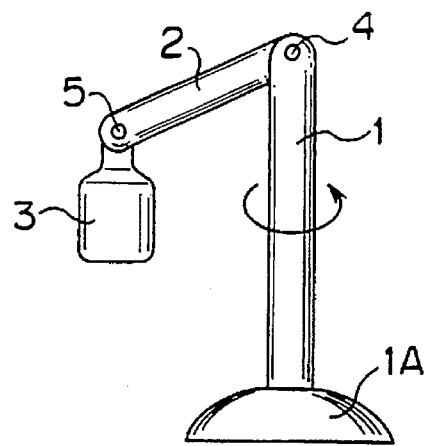
FIG. 1 is a schematic side-elevational view of an embodiment of a thin film producing apparatus according to the present invention.

FIG. 1 is a schematic illustration showing the general construction of an embodiment of a thin film producing apparatus according to the present invention. The shown apparatus utilizes a centrifugal force and comprises a high speed rotor or rotatable member 1 rotating on a base 1A, an arm 2 and a thin film production chamber 3. The arm 2 is pivotally supported on the high speed rotor 1 via a pin 4. The thin film production chamber 3 is pivotally suspended from the tip end of the arm 2 via a pin 5.

Figure 2:
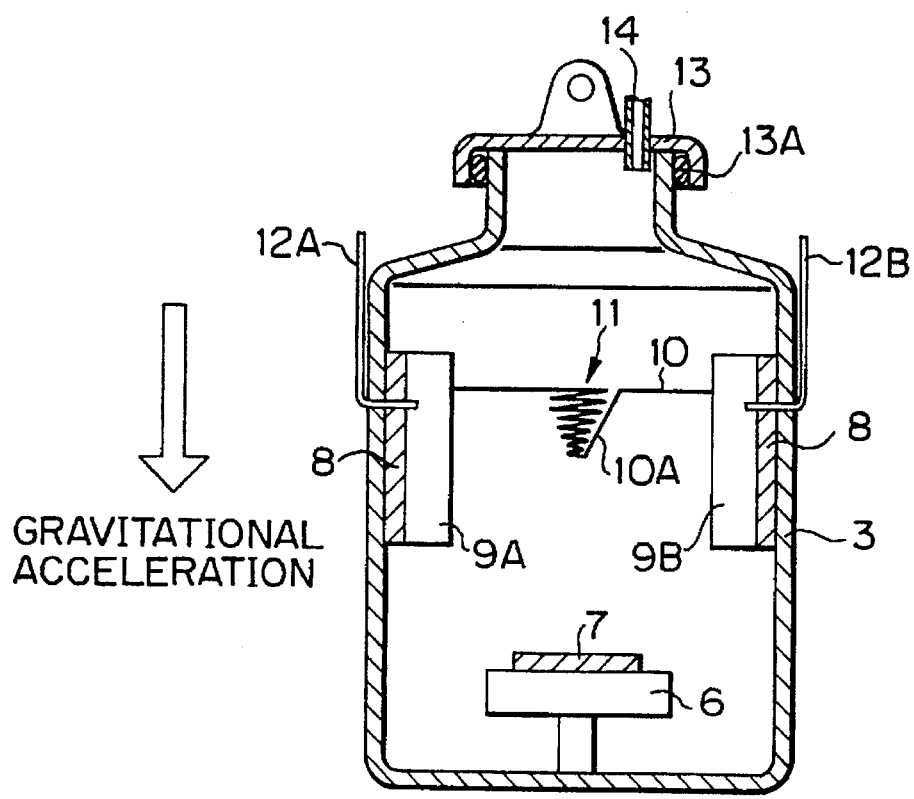
FIG. 2 is a cross-sectional view of a thin film production chamber according to the invention.

FIG. 2 is a schematic sectional view of the thin film production chamber 3 for vacuum deposition. A substrate 7 is supported on a holder 6 provided within the thin film production chamber 3. Also, electrodes 9A and 9B are fixed within the thin film production chamber 3 via insulators 8. The electrodes 9A and 9B are connected to an external power source via insulated electrical wirings 12A and 12B arranged along or in the arm 2 and the high speed rotor 1. By a tungsten filament 10 connected to the electrodes 9A and 9B, a material 11 to be deposited, which is inserted within the filament, is heated and evaporated. If necessary, the substrate 7 may also be heated. The thin film production chamber 3 is designed to permit ventilation and gas supply even during rotation through a tube 14 provided through a lid 13. An O ring 13A is provided for establishing a gas-tight seal of the thin film production chamber.

Figure 3:
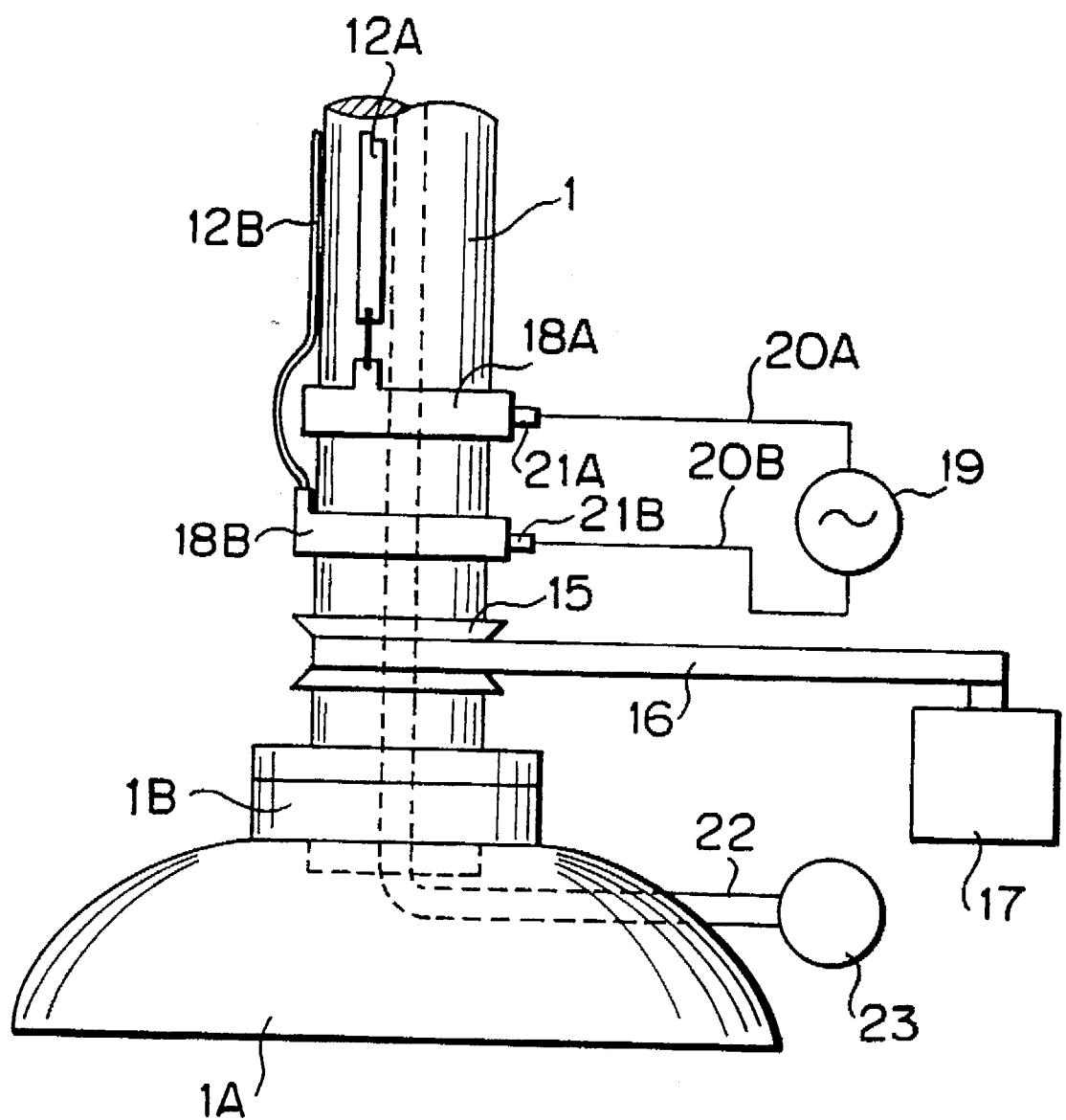
FIG. 3 is a side-elevational view of an embodiment of a rotating mechanism of a high speed rotation rotor.

FIG. 3 shows an example of the rotating mechanism of the high speed rotor 1.

The high speed rotor 1 is supported on the base 1A via bearing 1B. The high speed rotor 1 is driven to rotate by means of a motor 17 through a transmission mechanism having a pulley 15 and a belt 16 and so forth. On the external periphery of the high speed rotor 1, annular conductors 18A and 18B are fixed via an insulator which is not shown. The annular conductors 18A and 18B are connected to the insulated electrical wirings 12A and 12B. From the external power source 19, power is supplied to the tungsten filament 10 through wirings 20A, 20B, spring contacts 21A and 21B, annular conductors 18A and 18B and electrical wirings 12A and 12B. The rotation speed of the high speed rotor 1 can be controlled by controlling a revolution speed of the motor 17 or by providing a speed change mechanism, which is known per se, in the transmission mechanism. The external power source 19 may be either a direct current power source or an alternating current power source, and further may be a high frequency or an RF (or radio frequency) power source. A supply voltage or supply current for the tungsten filament 10 can be controlled by a known control means. In the embodiment discussed herein after, a commercial alternating power source is employed as the external power source.

The high speed rotor 1 and the arm 2 are formed as hollow pipes to provide piping 22 for ventilation and gas supply through the hollow interior space of the pipes. One end of piping 22 is connected to the tube 14. The other end of the piping 22 is connected for example to a vacuum pump 23.

Hereinafter, an example for forming a thin gold film on a silica glass substrate is described. Within a funnel shaped portion 10A of the tungsten filament 10, 10 grams of gold is placed as material 11 to be deposited. During a high speed rotation of rotor 1, the pressure in the thin film production chamber 3 was observed to be reduced by ventilation to $10^{-4}$ Torr. Subsequently, during the high speed rotation of rotor 1, power was supplied to the tungsten filament for heating the gold to 1100° C. to deposit the same on the silica glass substrate. An acceleration to be exerted on the thin film production chamber 3 is uniquely determined by the rotation speed of rotor 1 and the length of arm 2. When the length of arm 2 is one meter and the rotation speed of the high speed rotation rotor 1 is 94.5 r.p.m., the acceleration assumes a value equal to 10 times the normal gravitational acceleration, that is, a value equal to 10G. At this time, the deposition amount per unit time became approximately equal to 1 µm/min. The crystal grain size of the obtained film was approximately 0.2 µm. In comparison with deposition under normal gravitational acceleration conditions the above deposition rate was approximately three times greater. Moreover, the crystal grain size was approximately three times greater than that deposited under normal gravitational acceleration conditions. The quality of the film was good. By repeating physical deposition for a plurality of times under mutually different accelerations, a plurality of layers having mutually different crystal grain sizes could be obtained. Also, by performing deposition on the substrate placed obliquely relative to the direction of the gravitational acceleration, the crystal grain size and thickness of the film deposited on the substrate could be varied gradually.

Contrarily, where the substrate and the material source are arranged in a direction inverse to that shown in FIG. 2 with regard to the direction of gravitational acceleration or where the substrate is arranged at the top of the thin film production chamber 3 and the material source is arranged at the bottom of the chamber 3, the crystal grain size of the deposited film becomes very fine. However, in this case, the deposition rate becomes low.

The foregoing is an example of application of the invention for physical deposition of a material on a substrate. The invention is equally applicable for chemical deposition, in which case the tungsten filament 10 is removed from the thin film production chamber 3. Thereafter, power is supplied to a heater (not shown) provided in the holder 6 to heat the substrate 7. The pressure in the thin film production chamber is 1 reduced then upon which, under high acceleration, silane gas is supplied to the chamber 3 through piping 22. In the above manner, a thin film of polycrystalline silicon may be obtained. Also, by providing a plurality of material gas supply pipings, $CH_4$ gas, $H_2$ gas and Ar gas may be supplied on the silicon substrate. In the above manner, a diamond thin film may be be formed on the silicon substrate. The characteristics of the thin film obtained through the chemical deposition described above as is good as the thin film obtained by the physical deposition also described above.

Where the apparatus uses centrifugal force, it is effective to provide two or more arms and corresponding thin film production chambers and arrange them in symmetric positions with respect to the high speed rotor 1 for stability of the apparatus.

Also, while the foregoing embodiments involve the generation of a high gravity field by a centrifugal force, it is possible to use impact to achieve the results contemplated by the invention. It is also possible to create a high gravity environment upon the take-off of a satellite, a space shuttle and so forth.

The value of the acceleration generated according to the above methods should exceed the gravitational acceleration (1G), and is particularly effective at 3G or more. However, in view of the strength of the apparatus, the value the above acceleration may be limited to a maximum of approximately $10^4$G.

As set forth above, according to the present invention, the thin film can be produced at a speed which cannot be achieved in the prior art. Also, it becomes possible to precipitate crystals with a large grain size which cannot be obtained in the conventional process. These crystals can be freely designed by using the magnitude of gravitational acceleration as a parameter. Also, in principle, it is possible to distribute different materials according to the invention with sequentially varying distribution rates. Accordingly, the present invention is unique and effective in the field of material design, particularly in the field of thin film material design.

Although the invention has been illustrated and described with respect to an exemplary embodiment thereof, it should be understood by those skilled in the art that various other changes, omissions and additions may be made thereto, without departing from the spirit and scope of the present invention. Therefore, the present invention should not be understood being limited to the specific embodiment set out above but to include all possible embodiments which are within the scope of the appended claims and equivalents thereof.

What is claimed is:

1. A method for producing a thin film comprising the steps of:

placing a substrate having a surface for receiving the thin film on a substrate holder disposed within a thin film production chamber, the production chamber being connected by an arm to a rotatable member;

placing into the thin film production chamber a material to be deposited on the surface of the substrate;

rotating the rotatable member to generate a centrifugal force thereby creating a gravity field throughout the production chamber having a direction toward the surface of the substrate;

heating the substrate; and evaporating the material to be deposited by heating thereby accelerating the material to be deposited toward the surface of the substrate in a direction of the gravity field, whereby the material to be deposited is deposited on the surface of the substrate as the thin film.

2. The method according to claim 1, wherein the gravity field has a value which exceeds a value of the Earth's gravitational field.

3. The method according to claim 2, wherein the value of the gravity field is equal to at least three times the value of the Earth's gravitational field.

4. A method for producing a thin film, comprising the steps of:

placing a substrate having a surface for receiving the thin film on a substrate holder disposed within a thin film production chamber, the production chamber being connected by an arm to a rotatable member;

rotating the rotatable member to generate a centrifugal force thereby creating a gravity field throughout the production chamber having a direction toward the surface of the substrate;

heating the substrate; and supplying a raw gas of a material to be deposited as the thin film on the substrate via piping disposed within the rotatable member and the arm thereby accelerating the gas toward the surface of the substrate in a direction of the gravity field for decomposing the gas whereby the material to be deposited is deposited on the surface of the substrate as the thin film.

5. The method according to claim 4, wherein the gravity field has a value which exceeds a value of the Earth's gravitational field.

6. The method according to claim 5, wherein the value of the gravity field is equal to at least three times the value of the Earth's gravitational field.

7. The method according to claim 4, further including the step of supplying, together with the raw gas, gases different from the raw gas.

8. The method according to claim 7, wherein:
   the substrate is an Si substrate; and
   the raw gas is $CH_4$ gas, and the gases different from the raw gas are $H_2$ gas and Ar gas, whereby a diamond film is deposited on a surface of the Si substrate.

9. An apparatus for producing a thin film comprising:

a rotatable member;

a thin film production chamber connected to the rotatable member;

an arm interconnecting the rotatable member and the production chamber;

a substrate holder disposed within the production chamber, the substrate holder being adapted to receive a substrate thereon;

means connected to the rotatable member for rotating the rotatable member to generate a centrifugal force thereby creating a gravity field throughout the production chamber having a direction toward the surface of the substrate when the substrate is received on the substrate holder;

means disposed in the production chamber for heating the substrate when the substrate is received on the substrate holder; and means disposed in the production chamber for heating and evaporating a material to be deposited on the surface of the substrate when the substrate is received on the substrate holder thereby accelerating the material to be deposited toward the surface of the substrate in a direction of the gravity field, whereby the material to be deposited is deposited on the surface of the substrate as the thin film.

10. The apparatus according to claim 9, wherein the means for rotating is configured to generate a centrifugal force creating a gravity field having a value which exceeds a value of the Earth's gravitational field.

11. The apparatus according to claim 10, wherein the means for rotating is configured to generate a centrifugal force creating a gravity field having a value which is equal to at least three times the value of the Earth's gravitational field.

12. The apparatus according to claim 10, wherein the means for rotating is configured to generate a centrifugal force creating a gravity field having a value which is equal to at least three times the value of the Earth's gravitational field.

13. The apparatus according to claim 9, wherein the means for rotating is configured to generate a centrifugal force creating a gravity field having a value which exceeds a value of the Earth's gravitational field.

14. An apparatus for producing a thin film comprising:

a rotatable member;

a thin film production chamber connected to the rotatable member;

an arm interconnecting the rotatable member and the production chamber;

a substrate holder disposed within the production chamber, the substrate holder being adapted to receive a substrate thereon;

means connected to the rotatable member for rotating the rotatable member to generate a centrifugal force thereby creating a gravity field throughout the production chamber having a direction toward the surface of the substrate when the substrate is received on the substrate holder;

means disposed in the production chamber for heating the substrate when the substrate is received on the substrate holder; and piping disposed within the rotatable member and the arm for supplying a raw gas of a material to be deposited as the thin film on the surface of the substrate when the substrate is received on the substrate holder thereby accelerating the gas toward the surface of the substrate in a direction of the gravity field for decomposing the gas whereby the material to be deposited is deposited on the surface of the substrate as the thin film.

15. The apparatus according to claim 14, further including a plurality of thin film production chambers, the apparatus further comprising a plurality of arms each interconnecting the rotatable member and a corresponding one of the production chambers, the arms being disposed symmetrically about the rotatable member.

* * * * *